(12) United States Patent
Chiu

(10) Patent No.: US 8,242,838 B2
(45) Date of Patent: Aug. 14, 2012

(54) AMPLIFIER WITH WIDE GAIN RANGE

(75) Inventor: Ying-Chung Chiu, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 60 days.

(21) Appl. No.: 12/857,525

(22) Filed: Aug. 16, 2010

(65) Prior Publication Data
US 2012/0007673 A1    Jan. 12, 2012

(30) Foreign Application Priority Data

Jul. 6, 2010 (TW) ................................ 99122176 A

(51) Int. Cl.
*H03F 1/14* (2006.01)
*H03F 3/68* (2006.01)
(52) U.S. Cl. .......................................... 330/51; 300/295
(58) Field of Classification Search ...................... 330/51, 330/295, 311, 124 R, 136, 297, 148
See application file for complete search history.

(56) References Cited

U.S. PATENT DOCUMENTS 7,786,918 B2 *   8/2010   Fukuzawa et al. ............ 341/155

* cited by examiner

*Primary Examiner* — Robert Pascal
*Assistant Examiner* — Khiem Nguyen
(74) *Attorney, Agent, or Firm* — Jianq Chyun IP Office

(57) ABSTRACT

An amplifier with wide gain range includes a signal converting unit, a channel unit, and multiple amplifiers. The signal converting unit receives a gain modulation signal and accordingly outputs multiple modulation signals and multiple selection signals. Based on a level of the gain modulation signal, one of the selection signals is set at a first logic state and the other selection signals are at a second logic state. The channel unit has multiple channels, respectively controlled by the selection signals, so as to conduct the channel with at the first logic state. The amplifiers are connected in series. Output terminals of the amplifiers are also respectively output to the channels of the channel unit. The amplifiers are also controlled by the modulation signals of the signal converting unit.

12 Claims, 5 Drawing Sheets ure no. 99122176, filed on Jul. 6, 2010. The
AMPLIFIER WITH WIDE GAIN RANGE

CROSS-REFERENCE TO RELATED APPLICATION

This application claims the priority benefit of Taiwan application serial no. 99122176, filed on Jul. 6, 2010. The entirety of the above-mentioned patent application is hereby incorporated by reference herein and made a part of specification.

BACKGROUND OF THE INVENTION

1. Field of Invention

The present invention relates to amplifier with wide gain range, and more particularly to amplifier with wide gain range, which has low noise level.

2. Description of Related Art

Generally, for a single signal amplifier, its gain value is within a limited range. If it needs more gain value to have higher amplification of signal, usually, several amplifiers are connected in series. FIG. 1 is a drawing, schematically illustrating a conventional circuit of variable gain amplifier. In FIG. 1, the conventional variable gain amplifier is formed by several amplifiers 60, coupled in series. The amplifiers 60 respectively have gain ranges of VGA1, VGA2, . . . , VGN. The variable gain amplifiers having a number of N are controlled by the gain control signal, VC, so as to have the wide gain range.

For the circuit structure in FIG. 1, when it is operated at a low gain, each amplifier 600 is turned on, resulting in high noise level at the low gain.

Another kind of amplifier with wide gain range can be achieved by switching control. FIG. 2 is a drawing, schematically illustrating another conventional circuit of variable gain amplifier. In FIG. 2, several amplifiers 11-14 are connected in series by the switches 21-28 as an amplifier, having a signal input terminal 1 and signal output terminal 2. There are through lines 31-34 between the switches, and coupled with the amplifiers in parallel. The control circuit 3 controls the switches 21-28 via the connection lines 51-54 and modulates the gain values of the amplifiers via the connection lines 41-44. When the operating gain is lower than the maximum gain, just a portion of the amplifiers in the front part is turned on, and the signal is transmitted to the output terminal via the through lines 31-34.

In the structure, for example, just the first-stage amplifier 11 is turned on, the signal transmits through the through lines 32.33.34 connected in series with the action of switches. As a result, the extra loss of signal occurs, and the noise gets worse.

In other words, although the variable gain range can be formed by connecting multiple amplifiers, it causes larger noise level when it is operated at low gain level because multiple amplifiers are connected together. The convention amplifier with wide variable gain range does not further consider the noise level when operating at low gain.

SUMMARY OF THE INVENTION

An amplifier with wide gain range in the invention is provided but the noise level can be reduced.

An embodiment of the invention provides an amplifier with wide gain range includes a signal converting unit, a channel unit, and multiple amplifiers. The signal converting unit receives a gain modulation signal and accordingly outputs multiple modulation signals and multiple selection signals. Based on a level of the gain modulation signal, one of the selection signals is set at a first logic state and the other selection signals are at a second logic state. The channel unit has multiple channels, respectively controlled by the selection signals, so as to conduct the channel with at the first logic state. The amplifiers are connected in series. Output terminals of the amplifiers are also respectively output to the channels of the channel unit. The amplifiers are also controlled by the modulation signals of the signal converting unit.

An embodiment of the invention provides a gain modulation method for a wide gain range, so as to form an amplifier. The method includes outputting multiple modulation signals and multiple selection signals according to a gain modulation signal received. One of the selection signals, which are determined by a level of the modulation, is at a first logic state and the other selection signals are at a second logic state. Further, the method includes implementing multiple channels, respectively controlled by the selection signals to conduct the channel corresponding to the selection signal at the first logic state. Several amplifiers are connected in series. An output terminal of each of the amplifiers is respectively connected to the channels of the channel unit. Each amplifier is respectively controlled by the modulation signal of the signal converting unit.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

The amplifier with wide gain range can have various applications in electronic products. As an example to a receiver, the amplifier with wide gain range at low noise level is the essential part. For the conventional variable gain amplifier, in order to have larger gain range, it usually has a relative low noise level when a gain is operated about the maximum. However, as the need of the system specification, the noise level is still required to be low when the gain is operated at the other gain range. The invention can at least have relatively low noise level for the wide gain range.

Several embodiments are provided for describing the invention. However, the invention is not just limited to the embodiments. In addition, the embodiments can also be properly combined.

Figure 3:
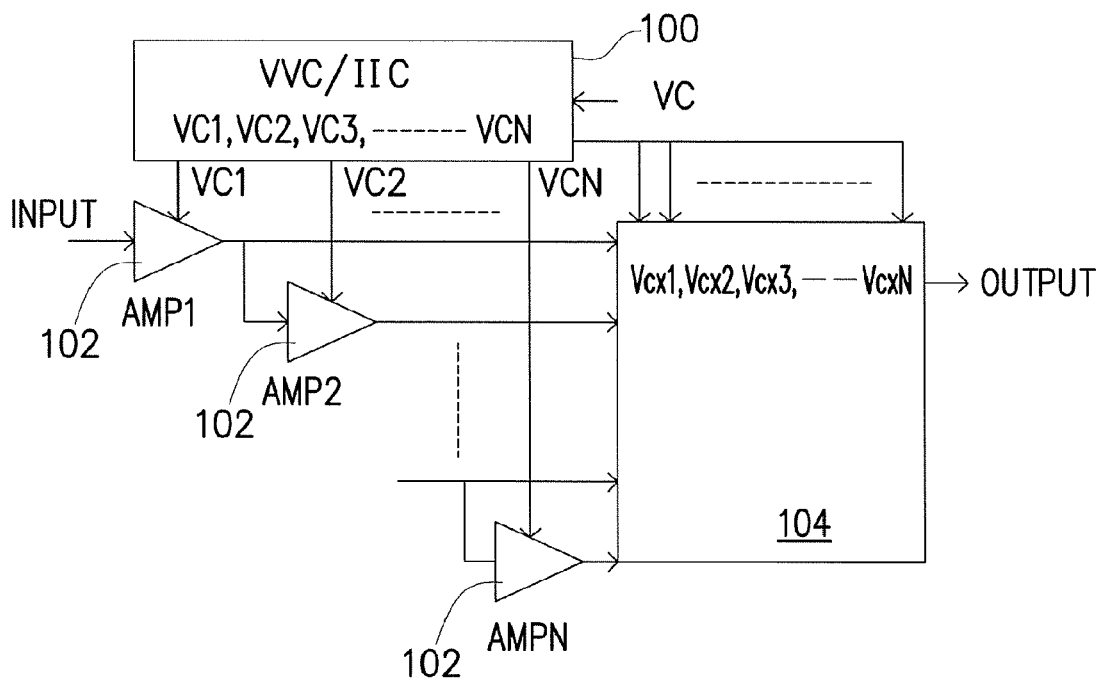
FIG. 3 is a drawing, schematically illustrating a circuit block structure of amplifier with wide gain range, according to an embodiment of the invention.

FIG. 3 is a drawing, schematically illustrating a circuit block structure of amplifier with wide gain range, according to an embodiment of the invention. In FIG. 3, the amplifier with wide gain rage includes a signal converting unit 100, several variable-gain amplifiers, and a channel unit 104.

The signal converting unit 100 is described by the examples of voltage to voltage converter (VVC) or current to current converter (IIC). However, it can also be voltage to current converter or current to voltage converter, or even any other converter to convert the received gain modulation signal. In the embodiment, the signal converting unit 100 outputs multiple modulation signal V1, V2,VN and selection signals Vcx1, Vcx2, . . . , VcxN, according to the gain modulation signal VC. One of the selection signals Vcx1, Vcx2, . . . , VcxN is set to the first logic state and the other the selection signals are set at the second logic state, according to the level of the gain modulation signal VC. In other words, the selection signal at the first logic state would conduct the corresponding connected channel in the channel unit 104. The second logic state of the selection signal would disconnect the corresponding channel.

The channel unit has several channels, respectively controlled by the selection signals to conduct the channel at the first logic state. The channel unit 104 can be multi-channel switching unit or multiple-channel multiplexer, or the circuit has the same equivalent function. According to the selection signal in control, intended channel of the channel unit 104 is conducted, and then outputs the signal (output).

Figure 4:
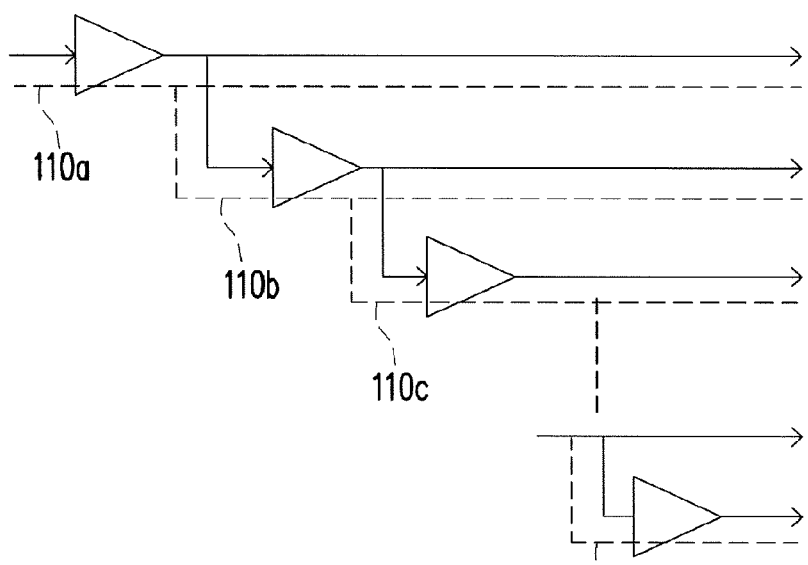
FIG. 4 is a drawing, schematically illustrating an operation mechanism of the amplifier with wide gain range.

FIG. 4 is a drawing, schematically illustrating an operation mechanism of the amplifier with wide gain range. In FIG. 4, the dashed line represents several channels 110a, 110b, 110c, . . . , 110n. Also referring to FIG. 3, when the selection signal Vcx1 is at the first logic state, the channel 110a is conducted, and the other channels 110b, 110c, . . . , 110n, controlled by the selection signals Vcx2, Vcx3, . . . , VcxN, are turned off. When it has be enough to have the operation gain by just turning on two amplifiers, the channel 110b can be turned on and the other channels are turned off. In the principle, one of channels can be selected to be conducted.

The variable-gain amplifiers 102, indicated by Amp1, Amp2, . . . , AmpN, are connected in series. The output terminals of the variable-gain amplifiers 102 are simultaneously and respectively output to the channels of the channel unit 104. The variable-gain amplifiers 102 are respectively controlled by the modulation signals VC1-VCN of the signal converting unit 100. The relation of the quantities of VC, VC1, VC2, . . . , VCN can be VC=VC1=VC2= . . . =VCN or all not equal, such as VC≠VC1≠VC2 . . . ≠VCN. The VC1 is the gain control voltage or gain control current of the amplifier Amp1. The VC2 is the gain control voltage or gain control current of the amplifier Amp2. The VCN is the gain control voltage or gain control current of the amplifier AmpN.

Figure 5:
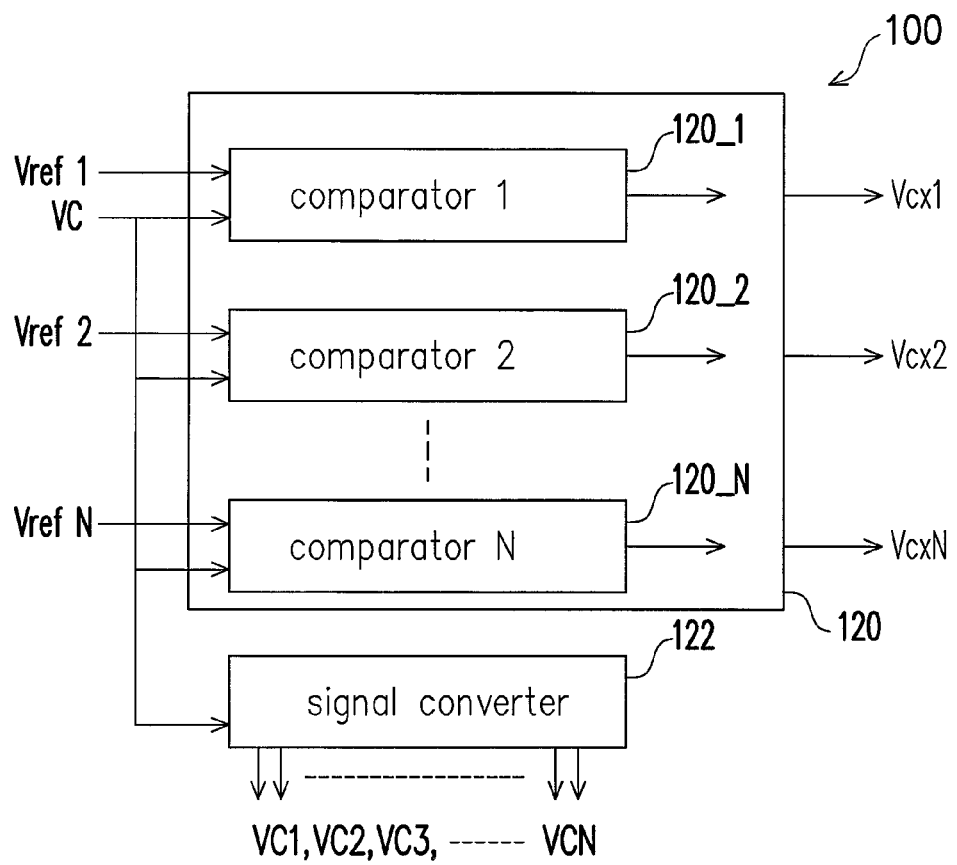
FIG. 5 is a drawing, schematically illustrating the circuit of the signal converting unit 100, according to an embodiment of the invention.

The operation mechanism of the signal converting unit 100 is further described. FIG. 5 is a drawing, schematically illustrating the circuit of the signal converting unit 100, according to an embodiment of the invention. In FIG. 5, the signal converting unit 100 includes a selection unit 120 and a signal converter 122, for example.

The selection unit 120, for example, includes several comparators 120_1-102_N for receiving several reference signals Vref, Vref2, . . . , VrefN corresponding to the channels of the channel unit 104, and also receiving the gain modulation signal VC. The gain modulation signal VC is compared with the reference signals to decide which one of the reference signals is less than the gain modulation signal VC and is the nearest one, and set the corresponding selection signal to be at the first logic state and set the other selection signals to be the second logic state. The manner shown in FIG. 5 is just one embodiment of options. With the same equivalent function, it can have other different design.

The signal Vcx1, Vcx2, . . . , and Vcxn are the control signals for the switching circuit. For example, when VC>Vref1, the signal channel is 110a and the switching circuit 1 is turn on. The other switching circuits are turned off. The output gain range of the output terminal (output) is provided by Amp1. Likewise, when VC>Vref2, the signal channel is 110b and the switching circuit 2 is turn on. The switching circuit 1 and the other switching circuits are turned off. The output gain range of the output terminal is provided by Amp1 and Amp2. With the principle, when VC>VrefN, the output gain range of the output terminal is provided by Amp1, Amp2, . . . , and AmpN.

The reference signals Vref1-Vref N are for example increasing. In this manner, the nearest one of the channel is determined to be conducted.

Figure 6:
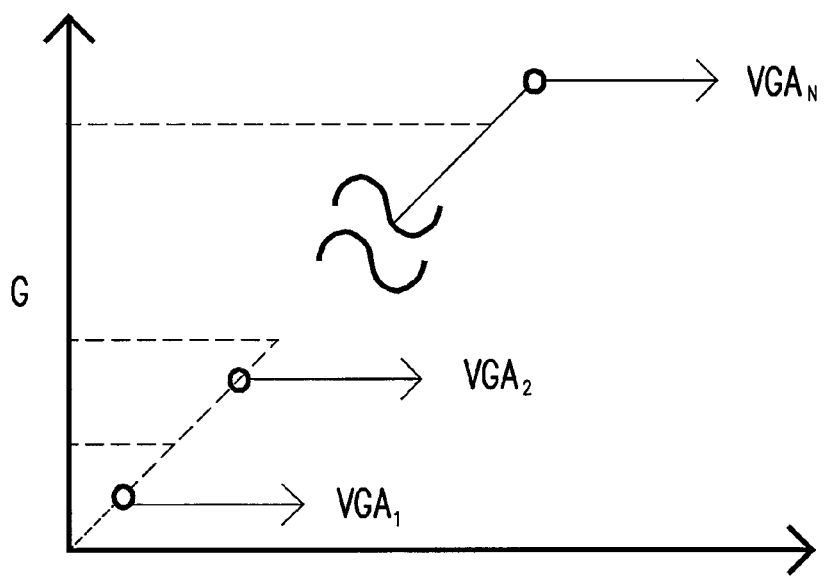
FIG. 6 is a drawing, schematically illustrating a relation between the operation gain G and the amplifiers being turned on, according to an embodiment of the invention.

Further, the signal converter 122 of the signal converting unit 100 is used to convert the gain modulation control signal VC into multiple modulation signal VC1-VCN to respectively modulate the amplifiers 102. By using the structure, a wide gain range can be formed, as shown in FIG. 6. FIG. 6 is a drawing, schematically illustrating a relation between the operation gain G and the amplifiers being turned on, according to an embodiment of the invention. When the operation gain G is not greater than $VGA_2$, the operation gain G is provided by the Amp1 with the gain $VGA_1$. The horizontal dashed line represents which amplifiers needs to be turned on when the operation gain G is intended. The invention can directly output without need of the additional switching circuits. As a result, the gain is improved and the noise level is reduced.

For the structure of the invention, the selected channel can has independent output via the channel unit 104. When it is operating at low gain range, the noise ratio can be effectively reduced.

The further verification on the mechanism to reduce the noise level is further described. In considering the low noise, it can be observed from equation (1). When several variable-gain amplifiers are connected in series, the noise level becomes larger.

$$F = F_1 + \frac{F_2 - 1}{G1} + \frac{F_3 - 1}{G1 \times G2} + \ldots + \frac{F_n - 1}{G1 \times G2 \times \ldots \times Gn - 1}, \quad (1)$$

where Fn is the noise level of the $n^{th}$ amplifier, Gn is the gain for respectively the $n^{th}$ one. When more amplifiers are connected in series, the noise gets larger.

Figure 1:
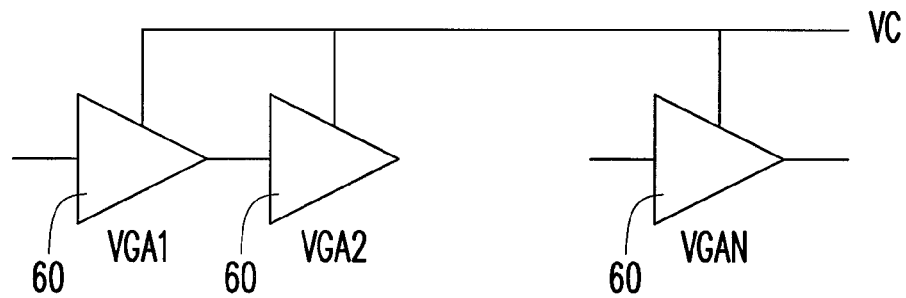
FIG. 1 is a drawing, schematically illustrating a conventional circuit of variable gain amplifier.
Figure 2:
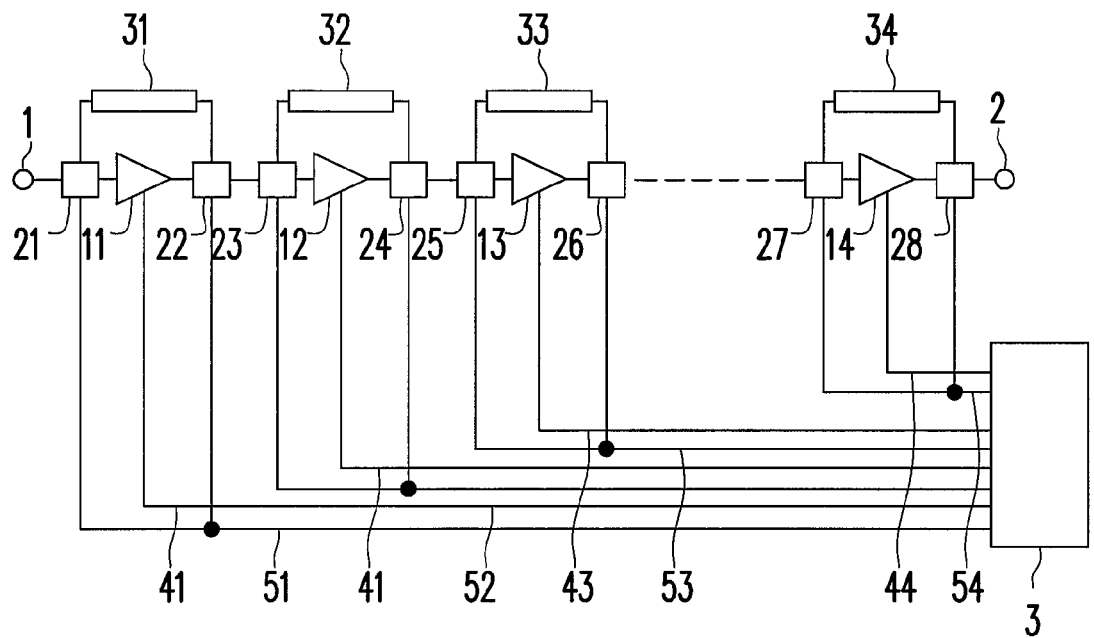
FIG. 2 is a drawing, schematically illustrating another conventional circuit of variable gain amplifier.
Figure 7:
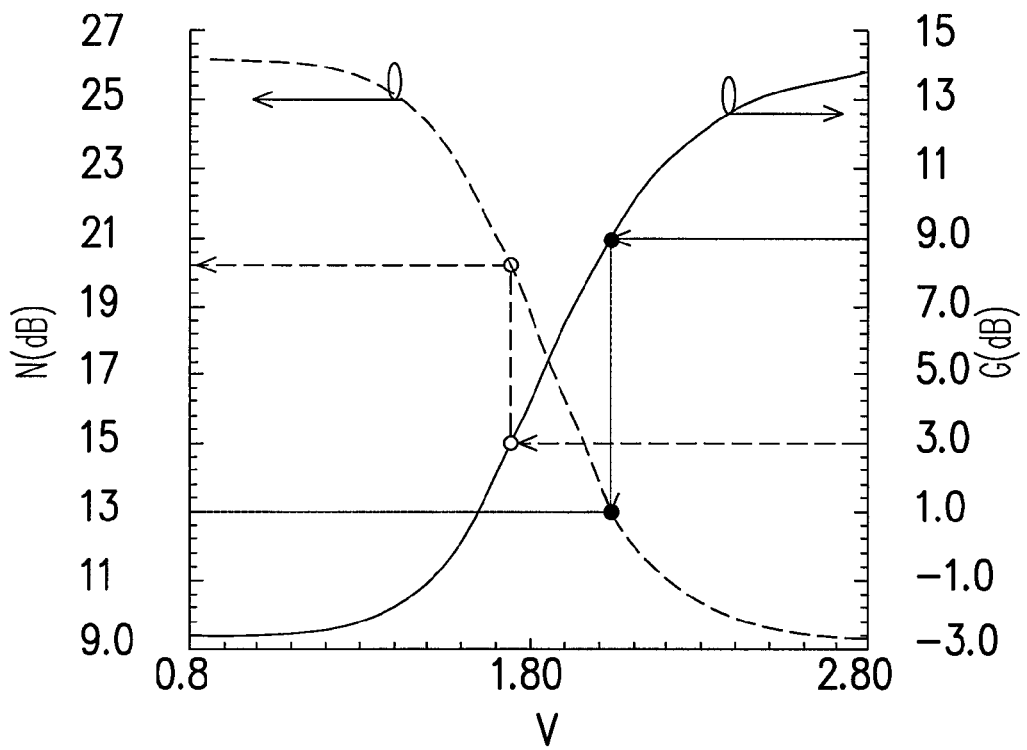
FIG. 7 is a drawing, schematically illustrating a relation between the amplifier with wide gain range and the noise level, according to an embodiment of the invention.

In addition, FIG. 7 is a drawing, schematically illustrating a relation between the amplifier with wide gain range and the noise level, according to an embodiment of the invention. In FIG. 7, the solid line is the operation gain. The dashed line is the noise corresponding to the operation gain. For a single variable-gain amplifier, the gain is for example 9 dB. The corresponding noise level is 13 dB. Based on the conventional couple in series, as shown in FIG. 1, 3-stage connected in series is taken as the example, and each stage of the amplifier provides 3 dB in gain, so as to have 9 dB in gain. The relative noise level is 13 dB plus the noises from the post two stages and reached to 20 dB. As can be seen, when more stages are coupled in series, the relative noise level at the low gain is relative high. If a smaller low noise level at low gain is intended, then the total gain range becomes small.

Alternatively, the output terminal just needs one switching circuit, the noise level from the post stage of the switching circuit become smaller. For example, when VC>Vref1, the channel 110a is conducted, the switching circuit 1 is turned on and the other switching circuit is turn off. The gain range at the output terminal is provided by Amp1. The noise level is $$F = F_1 + \frac{SF2 - 1}{G1},$$

where SF2 is the noise level of the switching circuit.

Figure 8:
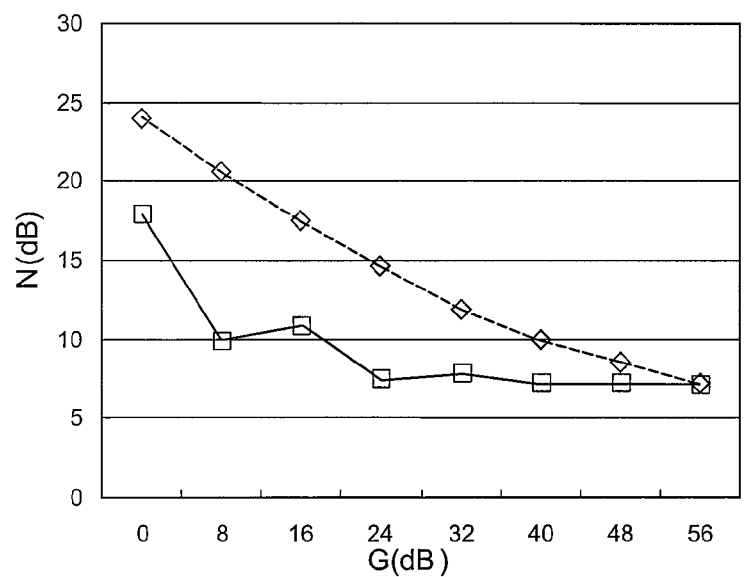
FIG. 8 is a drawing, schematically illustrating a comparison of gain and noise between the amplifier of the invention and the conventional amplifiers with four stages coupled in series, according to an embodiment of the invention.

FIG. 8 is a drawing, schematically illustrating a comparison of gain and noise between the amplifier of the invention and the conventional amplifiers with four stages coupled in series, according to an embodiment of the invention. In FIG. 8, the solid line is the relation between the gain and the noise level in the invention. The dashed line is the relation between the gain and the noise level for the conventional 4-stage amplifiers coupled in series. Each amplifier has gain range of 9 dB. As observed in verification data, the invention can has relatively less noise level when operating at low gain.

Figure 9:
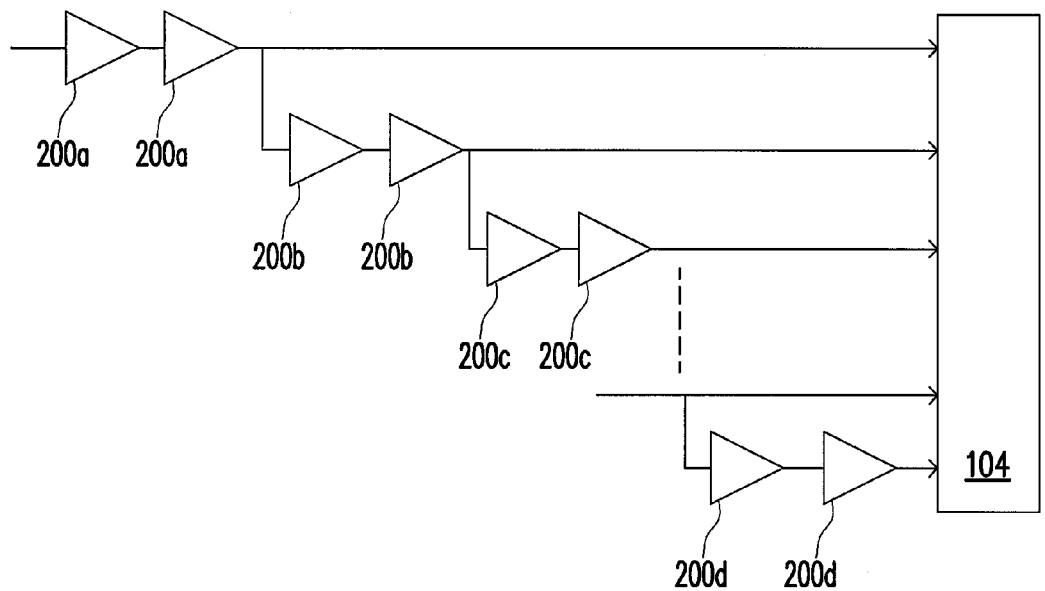
FIG. 9 is a drawing, schematically illustrating a circuit block of an amplifier with wide gain range, according to an embodiment of the invention.

Base on the concept in FIG. 3, each stage of amplifier can have different assembly. FIG. 9 is a drawing, schematically illustrating a circuit block of an amplifier with wide gain range, according to an embodiment of the invention. In FIG. 9, similar to the circuit in FIG. 3, only the part of the modification for the amplifier is described. Each stage of the amplifier can be, for example, composed of several secondary amplifiers. In the embodiment, two secondary amplifiers are taken as the example to form the singe-stage amplifier. The first-stage amplifier is composed of two amplifiers 200a, coupled in series. The second-stage amplifier is composed of two amplifiers 200b, coupled in series. The third-stage amplifier is composed of two amplifiers 200c, coupled in series. With the same principle, the last stage amplifier is composed of two amplifiers 200d, coupled in series.

Figure 10:
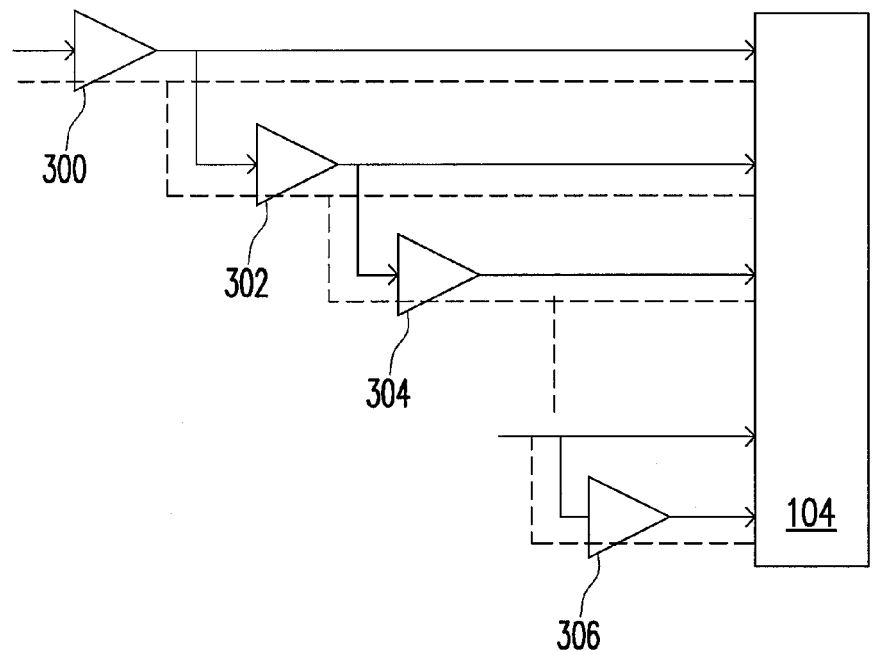
FIG. 10 is a drawing, schematically illustrating a circuit block of an amplifier with wide gain range, according to an embodiment of the invention.

In addition, the gain range for each stage of amplifier is not necessary to be all the same. FIG. 10 is a drawing, schematically illustrating a circuit block of an amplifier with wide gain range, according to an embodiment of the invention. In FIG. 10, the circuit structure is similar to FIG. 3, only the part of the modification for the amplifier is described. Each stage of amplifiers 300, 302, 304, . . . , 306 has different gain range without being all the same, such as being all different or just a part different, depending on the actual design in change. However, the basic structure still remains The operation mechanisms of the signal converting unit 100 and the channel unit 104 are the same.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. An amplifier with wide gain range, comprising:
a signal converting unit, according to a gain modulation signal received, accordingly outputting multiple modulation signals and multiple selection signals, wherein one of the selection signals is set at a first logic state and the other selection signals are set at a second logic state, based on a level of the gain modulation signal;
a channel unit, having a plurality of channels, respectively controlled by the selection signals, so as to conduct the channel with at the first logic state; and
a plurality of amplifiers, connected in series, wherein multiple output terminals of the amplifiers are also respectively outputting to the channels of the channel unit, and the amplifiers are also controlled by the modulation signals of the signal converting unit.

2. The amplifier with wide gain range of claim 1, wherein the channel unit is multi-channel switching circuit or multiple-channel multiplexer.

3. The amplifier with wide gain range of claim 1, wherein the signal converting unit comprises a voltage to voltage converter or a current to current converter, to convert the gain modulation signal into the modulation signals.

4. The amplifier with wide gain range of claim 1, wherein the signal converting unit comprises a selection unit, receiving a plurality of reference signals corresponding to the channels and also receiving the gain modulation signal, wherein the gain modulation signal is compared with the reference signals to decide a selected one of the selection signals being less than the gain modulation signal and the nearest to the gain modulation signal and set with the first logic state and set the other of the selection signals with the second logic state.

5. The amplifier with wide gain range of claim 4, wherein reference signals being compared are increasing.

6. The amplifier with wide gain range of claim 4, wherein the signal converting unit comprises a signal converter to convert the gain modulation signal into the modulation signals.

7. The amplifier with wide gain range of claim 1, wherein the modulation signals and the gain modulation signal are different.

8. The amplifier with wide gain range of claim 1, wherein at least one of the amplifiers is composed of a plurality of secondary amplifier coupled in series.

9. The amplifier with wide gain range of claim 1, wherein the signal converting unit determines a number of the modulation signals to be output, according to the gain modulation signal, to have an output gain level most close to a required level of the gain modulation signal.

10. A gain modulation method for wide gain range, suitable for use in an amplifier, comprising:
outputting multiple modulation signals and multiple selection signals according to a gain modulation signal received, wherein one of the selection signals is set at a first logic state according to a quantity of the gain modulation signal, and the other selection signals are set at a second logic state;
implementing multiple channels, respectively controlled by the selection signals to conduct one of the channels corresponding to the selection signal at the first logic state; and
connecting a plurality of amplifiers in series, wherein an output terminal of each of the amplifiers is respectively and simultaneously connected to the channels, and the amplifiers are respectively controlled by the modulation signals being output according to the gain modulation signal.

11. The gain modulation method of claim 10, wherein the step of outputting the multiple modulation signals and the multiple selection signals according to the gain modulation signal received comprises:

converting the gain modulation signal into the modulation signals;

receiving a plurality of reference signals and the gain modulation signal; and comparing the gain modulation signal with the reference signals to decide a selected one of the selection signals being less than the gain modulation signal and the nearest to the gain modulation signal and set with the first logic state and set the other of the selection signals with the second logic state.

12. The gain modulation method of claim 10, wherein a number of the modulation signals is determined according to the gain modulation signal, to have an output gain level most close to a required level of the gain modulation signal.

* * * * *